(12) United States Patent
Xiong et al.

(10) Patent No.: US 12,431,917 B2
(45) Date of Patent: Sep. 30, 2025

(54) SYSTEMS AND METHODS FOR DECODING CODEWORDS

(71) Applicant: InnoGrit Technologies Co., Ltd., Shanghai (CN)

(72) Inventors: Chenrong Xiong, San Jose, CA (US); Jie Chen, Shanghai (CN); Han Zhang, San Jose, CA (US); Jianing Chen, San Jose, CA (US); Yanfang Liu, Fremont, CA (US)

(73) Assignee: InnoGrit Technologies Co., Ltd., Shanghai (CN)

( * ) Notice: Subject to any disclaimer, the term of this patent is extended or adjusted under 35 U.S.C. 154(b) by 88 days.

(21) Appl. No.: 18/512,436

(22) Filed: Nov. 17, 2023

(65) Prior Publication Data

US 2025/0167812 A1    May 22, 2025

(51) Int. Cl.
 *H03M 13/00* (2006.01)
 *H03M 13/11* (2006.01)
 *H03M 13/15* (2006.01)
 *H03M 13/37* (2006.01)

(52) U.S. Cl.
 CPC ... *H03M 13/3746* (2013.01); *H03M 13/1105* (2013.01); *H03M 13/1575* (2013.01)

(58) Field of Classification Search
 CPC ......... H03M 13/1105; H03M 13/1575; H03M 13/3746; H03M 13/3753; H03M 13/2948; H03M 13/2951
 See application file for complete search history.

(56) References Cited

U.S. PATENT DOCUMENTS

| | | | |
|---|---|---|---|
| 10,043,582 B2 * | 8/2018 | Alhussien | G11C 7/1006 |
| 10,419,024 B2 * | 9/2019 | Xiong | H04L 1/0057 |
| 10,977,125 B2 * | 4/2021 | Mekhanik | H03M 13/1102 |
| 11,108,408 B2 * | 8/2021 | Kuo | H03M 13/2948 |
| 11,515,897 B2 * | 11/2022 | Cho | G06F 3/0679 |
| 11,923,867 B1 * | 3/2024 | Parthasarathy | H03M 13/1128 |
| 12,176,921 B2 * | 12/2024 | Cai | H03M 13/1108 |

* cited by examiner

*Primary Examiner* — Esaw T Abraham
(74) *Attorney, Agent, or Firm* — IPro, PLLC

(57) ABSTRACT

Disclosed herein are systems and methods that can avoid fruitless decoding iterations by terminating fruitless decoding iterations at an early stage. A method comprises: iteratively decoding a codeword by a decoder until a number of iterations at which a syndrome weight of the codeword exceeds a predetermined threshold. The method may further comprise: comparing the syndrome weight of the codeword with a decoder syndrome weight threshold for the decoder; in response to that the syndrome weight of the codeword is greater than or no less than the decoder syndrome weight threshold, terminating decoding of the codeword by the decoder.

14 Claims, 4 Drawing Sheets

SYSTEMS AND METHODS FOR DECODING CODEWORDS

TECHNICAL FIELD

The present disclosure relates to the technical field of information decoding, and more particularly, to systems and methods that can avoid fruitless decoding iterations.

BACKGROUND

A solid-state drive (SSD) controller is an integral part of an SSD. The SSD controller is responsible for managing the operations and functions of the SSD, and acts as an interface between a storage medium of the SSD and a host system. Low-Density Parity-Check (LDPC) codes are a type of error correction codes that may be used in the Error Correction Code (ECC) scheme because of their high error correction capability, low decoding complexity, and good adaptability to various applications and communication environments.

SUMMARY

Disclosed herein is a method comprising: iteratively decoding a codeword by a decoder until a number of iterations at which a syndrome weight of the codeword is greater than or no less than a predetermined threshold.

In an embodiment, the method further comprises: calculating the syndrome weight at each of the iterations.

In an embodiment, the method further comprises: comparing the syndrome weight with a decoder syndrome weight threshold for the decoder; in response to that the syndrome weight of the codeword is greater than or no less than the decoder syndrome weight threshold, terminating decoding of the codeword by the decoder.

In an embodiment, the method further comprises: determining whether the codeword is fully decoded by the decoder; in response to that the codeword is fully decoded, terminating decoding of the codeword by the decoder.

In an embodiment, the codeword is a low-density parity check (LDPC) code, a convolutional code, a Turbo code or a Polar code.

In an embodiment, the decoder is selected from a group consisting of a bit-flipping decoder, a min-sum decoder, a sum-product decoder, and a belief-propagation decoder.

Also disclosed herein is a method comprising:
step S1: comparing a syndrome weight of a codeword being decoded by a first decoder with a syndrome weight threshold for an iterative calculation of the first decoder; step
S2: in response to that the syndrome weight is less than or no greater than the syndrome weight threshold, performing step S5; otherwise performing step S3;
step S3: adding a counter value by an increment and comparing the counter value with a predetermined value;
step S4: in response to that the counter value is greater than or no less than a predetermined value, performing step S7; otherwise performing step S5;
step S5: decoding the codeword by the iterative calculation;
step S6: in response to that the codeword is not fully decoded by the iterative calculation and that the iterative calculation is the last iterative calculation of the first decoder, performing step S7;
step S7: terminating decoding of the codeword by the first decoder.

In an embodiment, the method further comprises: calculating the syndrome weight of the codeword before step S1.

In an embodiment, the codeword is a low-density parity check (LDPC) code, a convolutional code, a Turbo code or a Polar code.

In an embodiment, the method further comprises: decoding the codeword by a second decoder after step S7.

In an embodiment, before step S1, the method further comprises: step S0: comparing the syndrome weight of the codeword with a decoder syndrome weight threshold for the first decoder; in response to that the syndrome weight of the codeword is greater than or no less than the decoder syndrome weight threshold for the first decoder, performing step S7.

In an embodiment, the decoder is selected from a group consisting of a bit-flipping decoder, a min-sum decoder, a sum-product decoder, and a belief-propagation decoder.

The present disclosure includes a system comprising a processor configured to execute any one of the methods described above, wherein the system is a solid-state drive (SSD), a flash drive, a mother board, a processor, a computer, a server, a gaming device, or a mobile device.

The present disclosure includes a non-transitory machine-readable medium having information, wherein the information, when read by a hardware processor system, causes the hardware processor system to perform any one of the methods described above.

DETAILED DESCRIPTION

Figure 1:
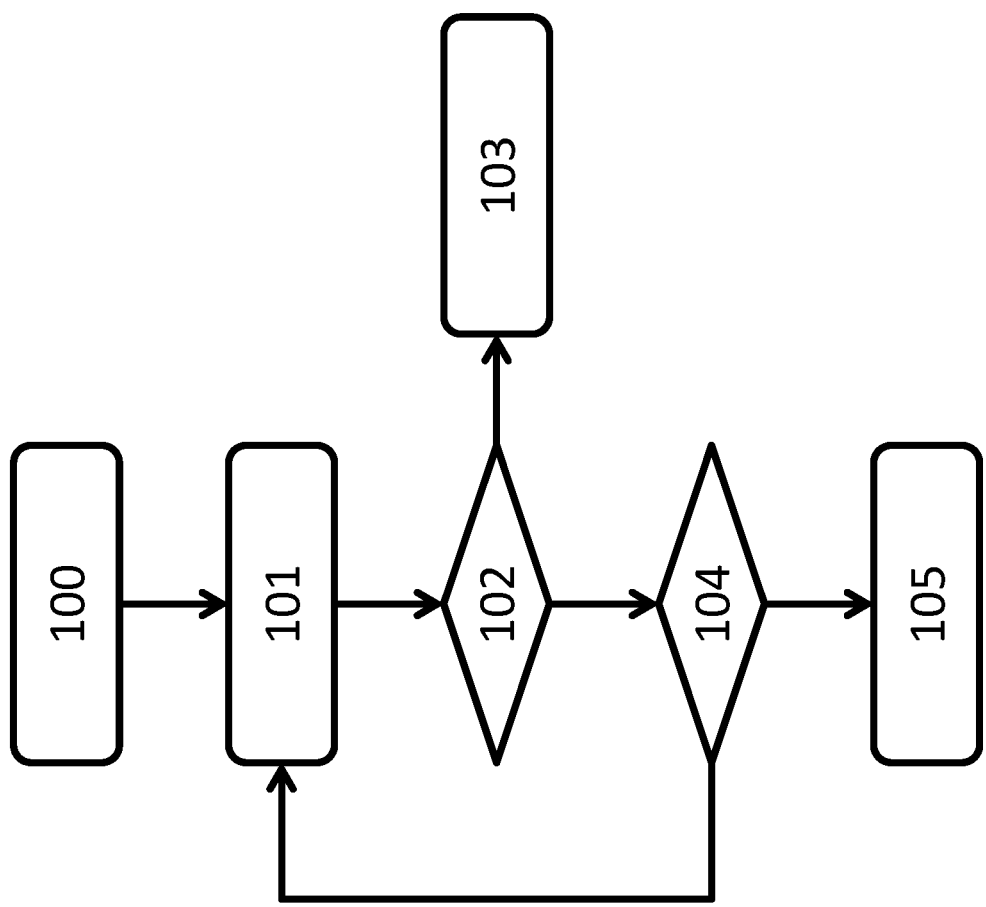
FIG. 1 shows a flowchart of decoding a codeword.

Specific embodiments according to the present disclosure will now be described in detail with reference to the accompanying figures. Like elements in the various figures are denoted by like reference numerals for consistency.

Several kinds of LDPC iterative decoders may be used in an SSD controller, including bit-flipping decoders, min-sum decoders, sum-product decoders, and belief-propagation decoders, etc. A process of decoding a codeword by an iterative decoder is shown in FIG. 1. First, at step 100, an iteration count i representing the number of iterations the decoder has run is initialized to be 0 after the codeword is received by the iterative decoder. Next, at step 101, an iterative decoding of the codeword is performed by the iterative decoder. Then, at step 102, it is determined whether the codeword is fully decoded in the current iteration. A codeword being fully decoded means that errors in the codeword are completely corrected, which may be represented by a syndrome weight of zero. If it is determined at step 102 that the decoder fully decodes the codeword, the process proceeds to step 103 in which decoding success is declared and the decoded codeword is made available for downstream processes. If it is determined at step 102 that the decoder fails to fully decode the codeword, the process proceeds to step 104. At step 104, it is determined whether the current iteration is the last iteration (i.e., whether the number of iterations the decoder has performed reaches a maximum iteration number preset for the decoder. If the current iteration is not the last iteration, the iteration count i will be increased by 1, and then the process returns to step 101 and repeats the above steps until the codeword is fully decoded or the decoder performs the maximum iteration number of iterations. If the current iteration is the last iteration, the process proceeds to step 105 in which decoding failure is declared. According to the decoding method as shown in FIG. 1, even if the decoder cannot decode the codeword, the decoder still performs all iterations defined by the preset maximum iteration number, resulting in potentially longer decoding latency.

Multi-level decoder architecture may be adopted in the SSD controller. In the multi-level decoder architecture, the decoding process is divided into multiple levels that are respectively limited to different degrees or capabilities of error correction. The multi-level decoder architecture may be implemented by a plurality of decoders with different error correction capabilities, such as first, second, . . . , and N-th decoders, N being an integer greater than 2. A decoder with a smaller error correction capability may be used first since it tends to have a higher decoding throughput and a shorter iteration latency. When the decoder with a smaller error correction capability cannot decode the codeword, another decoder with a larger error correction capability may be used next.

Figure 2:
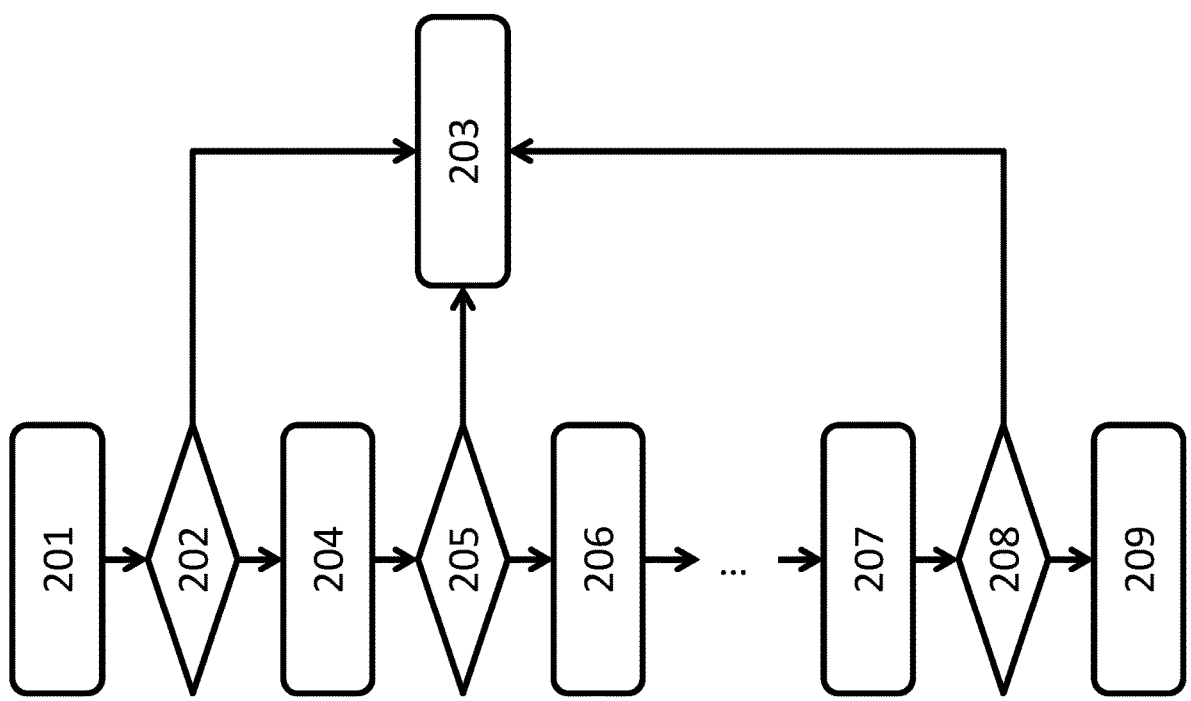
FIG. 2 shows a flowchart of decoding a codeword.

FIG. 2 shows a flowchart of decoding a codeword by a decoding system with a multi-level decoder architecture. The decoding system includes multiple decoders at different levels. At step 201, a first decoder is used to decode the codeword. The first decoder has the smallest error correction capability among the multiple decoders. At step 202, it is determined whether the codeword is fully decoded by the first decoder (i.e., whether all errors in the codeword are corrected). If it is determined at step 202 that the first decoder fully decodes the codeword, the process proceeds to step 203 in which decoding success is declared and the decoded codeword may be made available for other systems. If it is determined at step 202 that the first decoder cannot fully decode the codeword, the process proceeds to step 204. At step 204, a second decoder is used to decode the codeword, wherein the second decoder has the second smallest error correction capability among the multiple decoders. Next, at step 205, it is determined whether the codeword is fully decoded by the second decoder. If it is determined at step 205 that the second decoder fully decodes the codeword, the process proceeds to step 203. If it is determined at step 205 that the second decoder cannot fully decode the codeword, the process performs step 206. At step 206, a third decoder is used to decode the codeword, wherein the third decoder has the third smallest error correction capability among the multiple decoders. The process iterates through the multiple decoders in a similar fashion until the codeword is fully decoded or the last decoder of the multiple decoders fails to fully decode the codeword. The last decoder is used to decode the codeword at step 207. After step 207, it proceeds to step 208 to determine whether the codeword is fully decoded by the last decoder. If it is determined at step 208 that the last decoder fully decodes the codeword, the process proceeds to step 203; otherwise at step 209, decoding failure is declared.

In the decoding system as shown in FIG. 2, one or more decoders may fruitlessly attempt to decode the codeword before the codeword reaches one of the decoders that has sufficient capability to fully decode it. These fruitless decoding attempts not only result in a long decoding latency, but also increase the power consumption of the decoding system.

First Embodiment

Figure 3:
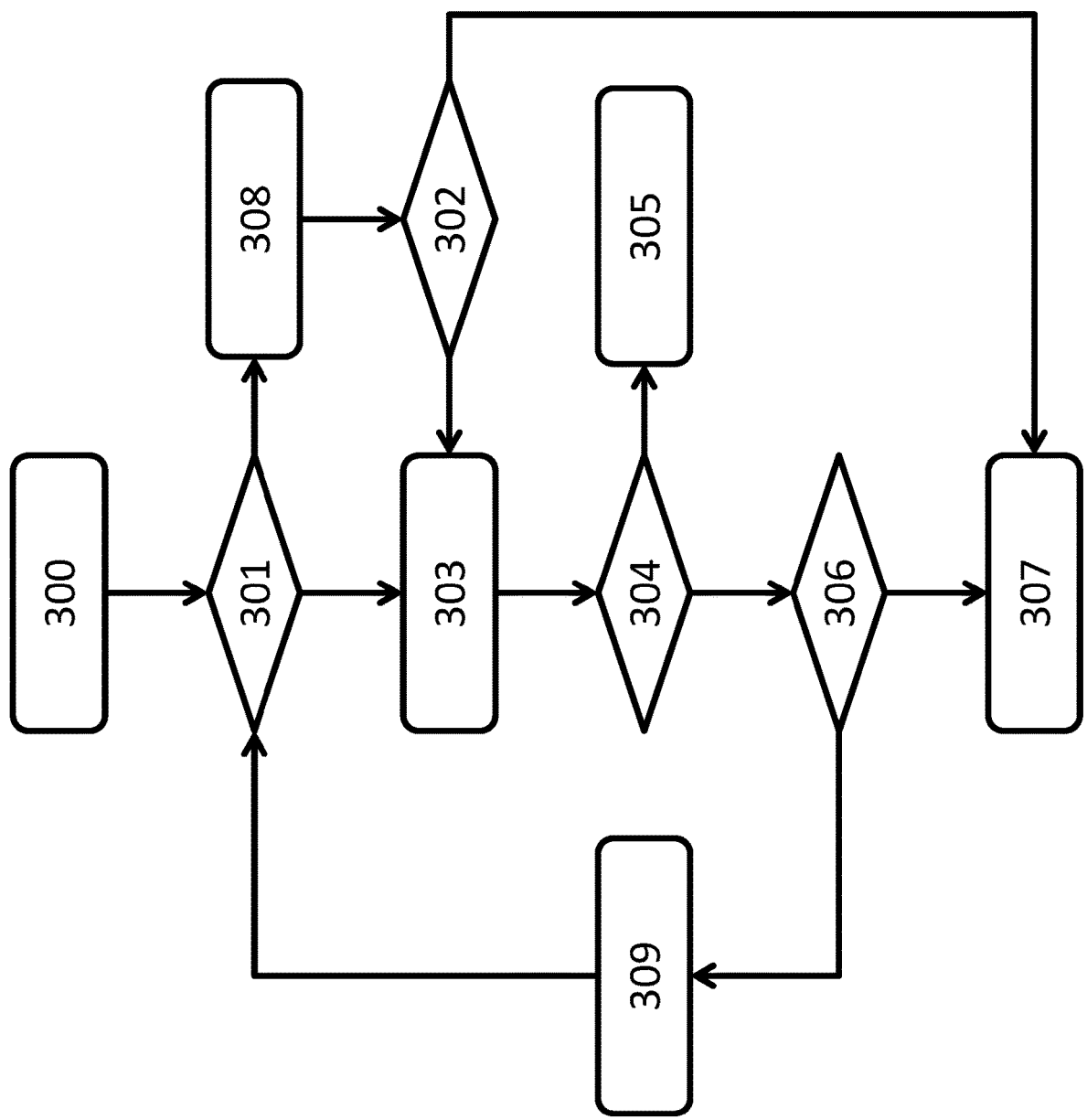
FIG. 3 shows a flowchart of a codeword decoding method according to an embodiment.

FIG. 3 shows a flowchart of a codeword decoding method. The codeword decoding method is implemented by an iterative decoder with a smart abortion scheme. In an implementation, the iterative decoder may be a bit-flipping decoder, a min-sum decoder, a sum-product decoder, a belief-propagation decoder. The iterative decoder may also other types of decoders, including other existing decoders or decoders which will be developed in the future. In this embodiment, for convenience of description, it is assumed that the iterative decoder has a maximum iteration number of m, and m syndrome weight thresholds thr_SA_sw[i] are predefined respectively for the m iterations of the decoder, where i=0, 1, 2, . . . , (m−1), and m is an integer greater than 2. That is, there is one predefined syndrome weight threshold for each iteration.

After the iterative decoder receives a codeword, which could be corrupted (e.g., with noise from a transmission channel), the codeword decoding method starts with step 300, in which a syndrome weight of the codeword is calculated and both an iteration count i and a counter value g are initialized to zero (i.e., i=0 and g=0). The term "codeword" here refers to information encoded by an encoding scheme, such as a sequence of symbols or bits generated by applying an error-correcting code to raw data. The codeword may a low-density parity check (LDPC) code, a convolutional code, a Turbo code, a Polar code or any other suitable encoded information. The term "syndrome weight" here refers to a weight of a syndrome vector of a codeword (e.g., the number of non-zero elements or bits in the syndrome vector). The syndrome may change during the process of decoding. The syndrome vector may be calculated by multiplying the codeword with the transpose of a parity check matrix. A non-zero syndrome vector represents that there are some discrepancies or errors in the codeword. The syndrome vector may include information about the presence and locations of errors within the codeword. For example, when a codeword has no errors, or all of errors in the codeword are corrected, the syndrome weight of the codeword may be zero. The iteration count i is used to calculate the number of iterations the iterative decoder has run through, and the counter value g is used to calculate the number of iterations in which the syndrome weight is greater than or no less than the syndrome weight threshold thr_SA_sw[i] of iteration i.

At step 301, it is determined whether the syndrome weight of the codeword is greater than or no less than the syndrome weight threshold thr_SA_sw[i] of iteration i. If it is determined at step 301 that the syndrome weight is greater than or no less than the syndrome weight threshold thr_SA_sw[i], the counter value g will be increased by an increment Δg in step 308, that is, g=g+Δg. Preferably, the increment Δg may be one. Then, at step 302, it is determined whether the counter value g is greater than or no less than a predetermined threshold thr_SA_g_cnt, wherein the predetermined threshold thr_SA_g_cnt is a threshold for the number of iterations at which that the syndrome weight is greater than the threshold thr_SA_sw[i]. If it is determined at step 302 that the counter value g is greater than or no less than the predetermined threshold thr_SA_g_cnt, the process proceeds to step 307 in which decoding failure is declared; otherwise the process proceeds to step 303.

On the contrary, if it is determined at step 301 that the syndrome weight is no greater than or less than the syndrome weight threshold thr_SA_sw[i], the process proceeds to step 303. At step 303, an iterative calculation of decoding the codeword is performed by the iterative decoder and then the syndrome weight is recalculated. When the iterative calculation of iteration i is completed, the process proceeds to step 304. At step 304, it is determined whether the codeword is fully decoded in the iterative calculation of iteration i. The codeword being fully decoded means that all of errors in the codeword are corrected, which may be represented by the syndrome weight being zero. If it is determined at step 304 that the codeword is fully decoded, the process proceeds to step 305 at which decoding success is declared; otherwise, the process proceeds to step 306. At step 306, it is determined whether the current iteration is the last iteration (i.e., whether the number of iterations the decoder has run through reaches the maximum iteration number m, or i=m). If it is determined at step 306 that the current iteration is not the last iteration, the iteration count i will be increased by 1 in step 309, that is, i=i+1, and then the process returns to step 301. If it is determined at step 306 that the current iteration is the last iteration, the process proceeds to step 307 at which decoding failure is declared.

As can be seen from the above, at every iteration, the syndrome weight of the codeword is checked to determine whether the syndrome weight is greater than or no less than the syndrome weight threshold of the iteration. When the syndrome weight is greater than or no less than the syndrome weight threshold of the iteration, and the number of iterations at which the syndrome weight is greater than or no less than the syndrome weight threshold of the iteration is greater than or no less than the predetermined threshold, the process of decoding is terminated early (i.e., without necessarily performing the maximum number m of iterations). This early termination may avoid or reduce fruitless decoding iterations and thus reducing the overall decoding latency.

Second Embodiment

Figure 4:
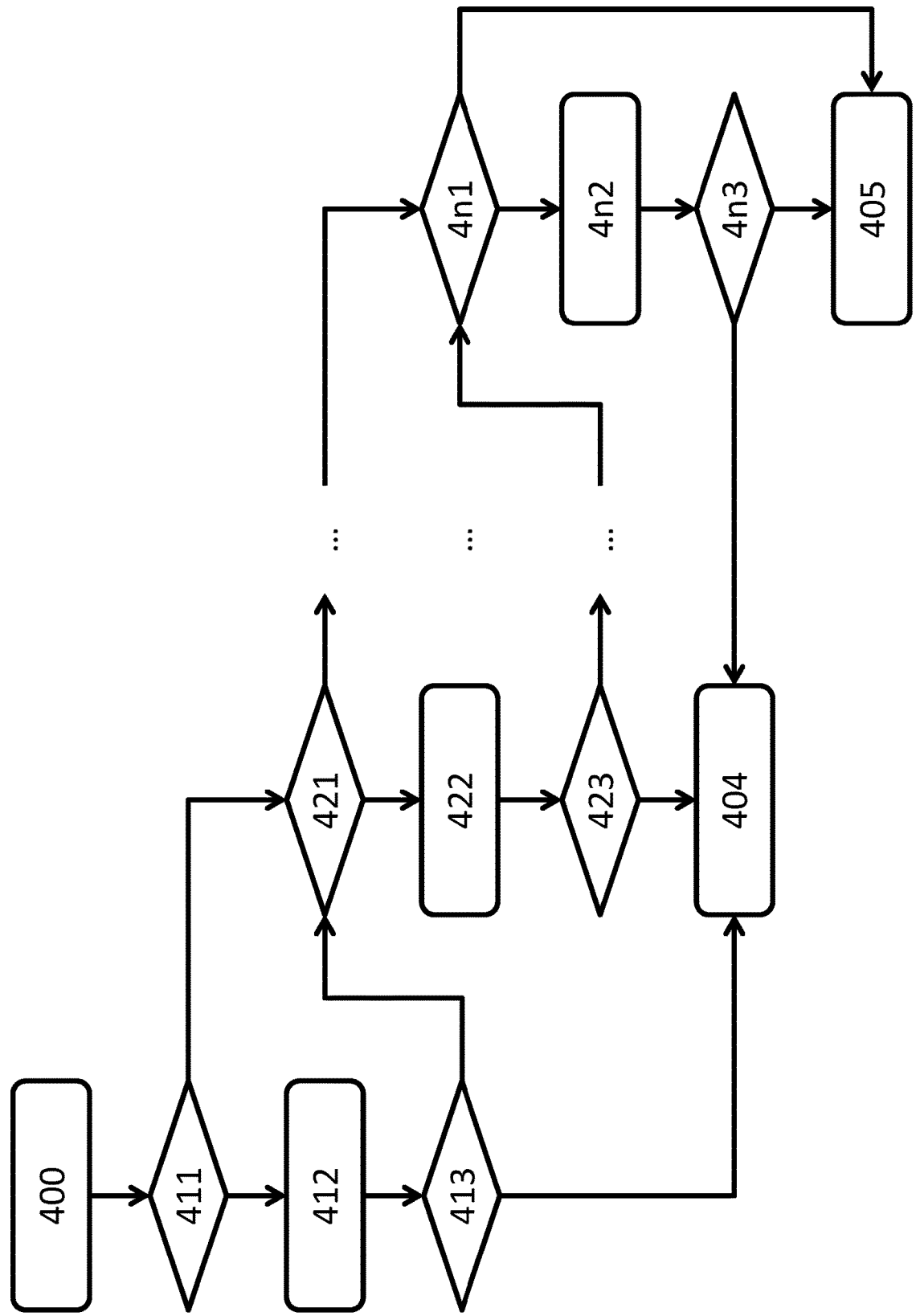
FIG. 4 shows a flowchart of a codeword decoding method according to an embodiment.

FIG. 4 shows a flowchart of a codeword decoding method. The codeword decoding method is implemented by a multi-level decoder system with a smart decoder selection scheme. The multi-level decoder system includes multiple decoders at different levels. In an implementation, each of the multiple decoders may be a bit-flipping decoder, a min-sum decoder, a sum-product decoder, or a belief-propagation decoder. In other implementations, the decoders may be other types of decoders, including other existing decoders or decoders which will be developed in the future. The multiple decoders may be the same type of decoders, or different types of decoders. For example, in a multi-level decoder system including three decoders, the three decoders are all bit-flipping decoders; or, one of the decoders is a bit-flipping decoder, one is a min-sum decoder, and one is a belief-propagation decoder; or, two of the decoders are bit-flipping decoders, and one is a min-sum decoder.

Each level of the multi-level decoder system may be responsible for a different degree of error correction, and decoders at different levels may have different error correction capabilities. A decoder at a previous level may have a smaller error correction capability than that of a decoder at a subsequent level. For example, in a multi-level decoder system including three decoders, a decoder at a first level has the smallest error correction capability, a decoder at a second level has the second smallest error correction capability, and a decoder at a third level has the largest error correction capability. A decoder with a smaller error correction capability may have a higher decoding throughout and a shorter iteration latency, and a decoder with a larger error correction capability may have a lower decoding throughout and a longer iteration latency.

In this embodiment, for convenience of description, it is assumed that there are n decoders, where n is an integer greater than 2; and every decoder has a decoder syndrome weight threshold. That is, there is a decoder syndrome weight threshold thr_SDS_sw[i] for decoder i, where i=1, 2, . . . , n. The decoder syndrome weight threshold is a threshold of determining whether the corresponding decoder is used to decode a codeword.

After the multi-level decoder system receives a codeword, the codeword decoding method starts with step 400. At step 40, a syndrome weight of the codeword is calculated, and then the syndrome weight of the codeword is compared with the decoder syndrome weight threshold thr_SDS_sw[i] for decoder i to determine whether the syndrome weight is less than the decoder syndrome weight threshold thr_SDS_sw[i]. An n-bit decoder-scheduling sequence may be generated according to the comparison between the syndrome weight and the decoder syndrome weight thresholds, where an i-th bit in the decoder-scheduling sequence is an enable flag bit [i] of decoder i. The n-bit decoder-scheduling sequence is an example; other data structures may be used to store the results of the comparison. When the syndrome weight is less than the decoder syndrome weight threshold thr_SDS_sw[i], the enable flag bit EF[i] of decoder i has a value of 1. The enable flag bit EF[i] being 1 indicates that decoder i will be used to decode the codeword. When the syndrome weight is not less than the decoder syndrome weight threshold thr_SDS_sw[i], the enable flag bit EF[i] of decoder i has a value of 0. The enable flag bit EF[i] being 0 indicates that decoder i will not be used to decode the codeword (i.e., decoder i will be skipped). For example, it is assumed that the multi-level decoder system includes 5 decoders, the syndrome weight of the received codeword is 987, thr_SDS_sw=[700, 800, 900, 1000, 1100], and a 5-bit decoder-scheduling sequence EF=[0, 0, 0, 1, 1] will be generated. The 5-bit decoder-scheduling sequence indicates that decoders 4 and 5 will be used to decode the received codeword sequentially.

At step 411, it is determined whether the value of the enable flag bit EF[1] of decoder 1, i.e., the first bit of the decoder-scheduling sequence, is 1 or 0. If the first bit of the decoder-scheduling sequence is 0, decoding of the codeword by decoder 1 will be skipped, and the process proceeds to step 421. If the first bit of the decoder-scheduling sequence is 1, it will proceed to step 412. At step 412, decoder 1 is used to decode the received codeword.

After decoder 1 decodes the received codeword at step 412, it is determined at step 413 whether the codeword is fully decoded by decoder 1. If it is determined at step 413 that the codeword is fully decoded, it will proceed to step 404 in which decoding success is declared; otherwise, the process proceeds to step 421.

At step 421, it is determined whether the value of the enable flag bit EF[2] of decoder 2, i.e., the second bit of the decoder-scheduling sequence, is 1 or 0. If the second bit of the decoder-scheduling sequence is 0, decoding of the codeword by decoder 2 will be skipped, and a step of determining whether the third bit of the decoder-scheduling sequence (i.e., the value of the enable flag bit EF[3] of decoder 3) is 1 or 0 (not shown in the figure) will be executed. If the second bit of the decoder-scheduling sequence is 1, it will proceed to step 422. At step 422, decoder 2 is used to decode the received codeword.

After step 422, it is determined at step 423 whether the codeword is fully decoded by decoder 2. If it is determined at step 423 that the codeword is fully decoded, it will proceed to step 404 described above; otherwise, the step of determining whether the third bit of the decoder-scheduling sequence (i.e., the value of the enable flag bit EF[3] of decoder 3) is 1 or 0 will be executed. Similar steps are performed for decoders 3, 4, . . . , and (n−1), which will be omitted here to avoid redundancy.

If none of decoders 1, 2, . . . , and (n−1) fully decodes the codeword, step $4n1$ will be executed. At step $4n1$, it is determined whether the value of the enable flag bit EF[n] of decoder n, i.e., the n-th bit of the decoder-scheduling sequence, is 1 or 0. If the n-th bit of the decoder-scheduling sequence is 0, decoding of the codeword by decoder n will be skipped, and it will be proceed to step 405 in which decoding failure is declared. If the n-th bit of the decoder-scheduling sequence is 1, it will proceed to step $4n2$. At step $4n2$, decoder n is used to decode the received codeword. After step $4n2$, it is determined at step $4n3$ whether the codeword is fully decoded by decoder n. If it is determined at step $4n3$ that the codeword is fully decoded, it will proceed to step 404 described above; otherwise, it will proceed to step 405 described above.

According to the codeword decoding method using the multi-level decoder system with the smart decoder selection scheme provided in this embodiment, the decoder-scheduling sequence is generated by comparing the syndrome weight of the received codeword and the decoder syndrome weight threshold predefined for each decoder, so that the fruitless decoders can be skipped to reduce the decoding latency and save the power consumption of the whole system.

Example

In this example, three decoders (i.e., decoders 1, 2 and 3) are used to decode a codeword. Among the three decoders, the maximum iteration number of decoder 1 is 8 with the latency of each iteration being 2t (t being a unit of time clock), the maximum iteration number of decoder 2 is 10 with the latency of each iteration being 3t, and the maximum iteration number of decoder 3 is 12 with the latency of each iteration being 4t. The codeword is a codeword that cannot be corrected by decoders 1 and 2, but can be corrected by decoder 3 after 5 iterations.

When the decoding method shown in FIG. 2 is used to decode the codeword, the overall decoding latency is 8×2t+10×3t+5×4t=66t. In contrast, when the codeword decoding method according to the first embodiment is used to decode the codeword, the iterative calculation of decoder 1 is terminated after 4 iterations, and the iterative calculation of decoder 2 is terminated after 5 iterations. Therefore, the overall decoding latency is 4×2t+5×3t+5×4t=43t, which is shorter than the overall decoding latency of 66t.

When the codeword decoding method according to the second embodiment of the present disclosure is used to decode the codeword, by comparing the syndrome weight of the codeword with the decoder syndrome weight threshold of each decoder, it is decided to skip decoders 1 and 2 and only use decoder 3 to decode the codeword. In this case, the overall decoding latency is 5×4t=20t, which is much shorter than the overall decoding latency of 66t using the existing codeword decoding method.

Although the codeword decoding methods according to the first and second embodiments are used individually in this example, the two codeword decoding methods may also be used in combination. Specifically, each decoder included in the multi-level decoder system of the second embodiment may be an iterative decoder with the smart abortion scheme described in the first embodiment, so that both the smart abortion scheme and the smart decoder selection scheme are implemented in a codeword decoding method.

In an exemplary embodiment of the present disclosure, there is provided a system. The system may comprise a processor configured to execute any one of the methods described above. For example, the system may be an SSD, a flash drive, a mother board, a processor, a computer, a server, a gaming device, or a mobile device.

In an exemplary embodiment of the present disclosure, there is provided a non-transitory machine-readable medium having information. The information, when read by a hardware processor system, may cause the hardware processor system to perform any one of the methods described above.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method comprising:
   iteratively decoding a codeword by a decoder until a number of iterations at which a syndrome weight of the codeword is greater than or no less than a predetermined threshold;
   comparing the syndrome weight with a decoder syndrome weight threshold for the decoder; in response to that the syndrome weight of the codeword is greater than or no less than the decoder syndrome weight threshold, terminating decoding of the codeword by the decoder;
   wherein the decoder is selected from a group consisting of a bit-flipping decoder, a min-sum decoder, a sum-product decoder, and a belief-propagation decoder.

2. The method of claim 1, further comprising: calculating the syndrome weight at each of the iterations.

3. The method of claim 1, further comprising: determining whether the codeword is fully decoded by the decoder; in response to that the codeword is fully decoded, terminating decoding of the codeword by the decoder.

4. The method of claim 1, wherein the codeword is a low-density parity check (LDPC) code, a convolutional code, a Turbo code or a Polar code.

5. The method of claim 1, further comprising decoding the codeword by another decoder.

6. A system comprising a processor configured to execute the method of claim 1, wherein the system is a solid-state drive (SSD), a flash drive, a mother board, a processor, a computer, a server, a gaming device, or a mobile device.

7. A non-transitory machine-readable medium having information, wherein the information, when read by a hardware processor system, causes the hardware processor system to perform the method of claim 1.

8. A method, comprising:
   step S1: comparing a syndrome weight of a codeword being decoded by a first decoder with a syndrome weight threshold for an iterative calculation of the first decoder;
   step S2: in response to that the syndrome weight is less than or no greater than the syndrome weight threshold, performing step S5; otherwise performing step S3;
   step S3: adding a counter value by an increment and comparing the counter value with a predetermined value;

step S4: in response to that the counter value is greater than or no less than a predetermined value, performing step S7; otherwise performing step S5;

step S5: decoding the codeword by the iterative calculation;

step S6: in response to that the codeword is not fully decoded by the iterative calculation and that the iterative calculation is the last iterative calculation of the first decoder, performing step S7;

step S7: terminating decoding of the codeword by the first decoder;

wherein the decoder is selected from a group consisting of a bit-flipping decoder, a min-sum decoder, a sum-product decoder, and a belief-propagation decoder.

9. The method of claim 8, further comprising: calculating the syndrome weight of the codeword before step S1.

10. The method of claim 8, wherein the codeword is a low-density parity check (LDPC) code, a convolutional code, a Turbo code or a Polar code.

11. The method of claim 8, further comprising decoding the codeword by a second decoder after step S7.

12. The method of claim 8, further comprising, before step S1:

step S0: comparing the syndrome weight of the codeword with a decoder syndrome weight threshold for the first decoder; in response to that the syndrome weight of the codeword is greater than or no less than the decoder syndrome weight threshold for the first decoder, performing step S7.

13. A system comprising a processor configured to execute the method of claim 8, wherein the system is a solid-state drive (SSD), a flash drive, a mother board, a processor, a computer, a server, a gaming device, or a mobile device.

14. A non-transitory machine-readable medium having information, wherein the information, when read by a hardware processor system, causes the hardware processor system to perform the method of claim 8.

* * * * *